(12) United States Patent
Bautch

(10) Patent No.: US 12,117,477 B2
(45) Date of Patent: Oct. 15, 2024

(54) TOW ELECTRICAL TESTER

(71) Applicant: Curt Manufacturing, LLC, Eau Claire, WI (US)

(72) Inventor: Troy Bautch, Eleva, WI (US)

(73) Assignee: CURT Manufacturing, LLC, Eau Claire, WI (US)

( * ) Notice: Subject to any disclaimer, the term of this patent is extended or adjusted under 35 U.S.C. 154(b) by 103 days.

(21) Appl. No.: 17/981,706

(22) Filed: Nov. 7, 2022

(65) Prior Publication Data
US 2024/0151761 A1 May 9, 2024

Related U.S. Application Data

(60) Provisional application No. 63/277,111, filed on Nov. 8, 2021.

(51) Int. Cl.
*G01R 31/00* (2006.01)
(52) U.S. Cl.
CPC .................................. *G01R 31/006* (2013.01)
(58) Field of Classification Search
CPC ........................................................ G01R 31/006
USPC ........................................................ 324/76.47
See application file for complete search history.

(56) References Cited

U.S. PATENT DOCUMENTS

| | | | | |
|---|---|---|---|---|
| 4,271,388 A | * | 6/1981 | Schaling .............. | G01R 31/58 324/542 |
| 5,424,720 A | * | 6/1995 | Kirkpatrick .......... | F25D 29/003 346/33 TP |
| 5,635,843 A | * | 6/1997 | Borland ............... | G01R 31/54 324/504 |
| 5,936,407 A | * | 8/1999 | Borland ............... | G01R 31/58 324/504 |
| 6,297,646 B1 | * | 10/2001 | Lang ................... | G01R 19/155 324/504 |

(Continued)

FOREIGN PATENT DOCUMENTS

DE        10006490 A1 * 8/2001 .......... G01R 31/006

OTHER PUBLICATIONS

Curt Manufacturing, LLC, "How To Test A 7-Way RV Blade Style Plug Using The I-27 Tester", published online at https://assets.curtmfg.com/masterlibrary/58270/installsheet/58270_INS.pdf, admitted prior art.

*Primary Examiner* — Christopher P McAndrew
(74) *Attorney, Agent, or Firm* — Shewchuk IP Services, LLC; Jeffrey D. Shewchuk

(57) ABSTRACT

A tow electrical tester includes a housing having a socket defining positions for at least four electrical connections between a towing vehicle and a towed vehicle, with the preferred embodiment shown having seven such socket positions. A plurality of indicator LEDs are exposed on a distal end of the housing. An electrical circuit within the housing connects each LED in a circuit branch between a common/ground socket position and one of the other socket positions. The electrical circuit includes a primary series resistor within the housing arranged in series for each LED, which protects the LED and adjusts the forward voltage across the LED. For at least some of the circuit branches, a secondary parallel resistor is added within the housing arranged in parallel with the associated primary series resistor and indicator LED, thereby increasing current draw within that branch to meet the requirements of "trailer present" detection circuits.

19 Claims, 5 Drawing Sheets

(56) References Cited

U.S. PATENT DOCUMENTS

| | | | | |
|---|---|---|---|---|
| 6,525,654 | B1* | 2/2003 | Siggers | G01R 31/006 |
| | | | | 701/32.7 |
| 7,336,082 | B1* | 2/2008 | Mofield | G01R 31/006 |
| | | | | 324/504 |
| 8,947,096 | B1* | 2/2015 | Wolf | B60Q 11/007 |
| | | | | 324/504 |
| 11,318,883 | B1* | 5/2022 | Kulkarni | B60Q 11/007 |
| 11,390,256 | B2 | 7/2022 | Lange, III et al. | |
| 2005/0275409 | A1* | 12/2005 | Mason | G01R 31/69 |
| | | | | 324/508 |
| 2020/0088777 | A1* | 3/2020 | Marshall | G01R 1/0416 |
| 2020/0298642 | A1* | 9/2020 | Arakelian | B60Q 1/305 |

* cited by examiner

TOW ELECTRICAL TESTER

CROSS-REFERENCE TO RELATED APPLICATION(S)

The present application claims priority from U.S. Provisional Application No. 63/277,111 entitled TOW ELECTRICAL TESTER filed Nov. 8, 2021, incorporated herein by reference.

BACKGROUND OF THE INVENTION

The present application relates to testers to check the electrical functioning of electrical circuits on towed trailers or other towed vehicles which are electrically connected to a tow vehicle.

Many trailers and similar towed vehicles include electrical circuits which are either powered exclusively by an electrical connection from a tow vehicle or at least derive a control signal based on an electrical contact with the tow vehicle. For instance, common four way electrical tow connections include contacts for:
   a) a "hot" power wire, typically colored black, connected to the corresponding terminal of the towing vehicle battery;
   b) a neutral or ground power wire, typically colored white, connected to the corresponding terminal of the towing vehicle battery;
   c) a right turn/brake signal, typically colored green, which can be activated either for timed on-off intervals for a right blinker signal or on continuously whenever the driver steps on the brake pedal of the towing vehicle with the blinker off; and
   d) a left turn/brake signal, typically colored yellow, which can be activated either for timed on-off intervals for a left blinker signal or on continuously whenever the driver steps on the brake pedal of the towing vehicle with the blinker off.

In common seven way electrical tow connections using the SAE standard, contacts are included additionally for;
   e) a brake power signal wire, typically colored blue, indicative of braking power to be applied to the towed trailer or towed vehicle brakes
   f) a tail/marker light signal (marker lights are also called "running lights"), typically colored brown and powered whenever the towing vehicle headlights or marker/running lights are on; and
   g) a reverse or back-up signal, typically colored purple, powered whenever the vehicle is in reverse gear.

In common seven way electrical tow connections using the RV standard, red and brown wires are used for the left and right turn/brake lights signals, respectively, and green and yellow wires are used for the tail/running light signal and the reverse signal, respectively. Common four wire outputs used in brake controllers include the black and white hot and neutral power connections and the blue brake power signal wire, and then output the brake signal on a red wire.

Part of towing responsibly is making sure trailer lights are working properly. As with any electrical system, there are occasions when shorts or faults occur in the electrical system for a towed vehicle. Testing is essential after installing a new custom towing-vehicle-to-trailer wiring harness, and is highly recommended every time a trailer is hitched up to tow. In identifying and/or troubleshooting such shorts or faults, it can be difficult to quickly and readily determine whether the short or fault is part of the towing vehicle electrical system or wiring, part of the towed vehicle electrical system (such as a faulty light bulb) or wiring, or due to a poor or missing connection between the two vehicles.

To assist in the identifying/troubleshooting task, electrical testers are known which pair an LED for each circuit connection relative to the common or neutral wire. A towing connector tester works by plugging into the towing electrical connection socket on the towing vehicle and responding to the various electrical signals produced by pushing the brake pedal on the towing vehicle, signaling a turn on the towing vehicle, turning on the running lights on the towing vehicle and so on. When the socket is getting proper power, the tester's various LEDs should light up corresponding to each wire in the connector. For instance, product number 58270 from CURT Manufacturing of Eau Claire, Wisconsin is a tester for a seven way connection, which includes six red LEDs, labeled 12V, RT, LT, BK, TM and BU for each circuit associated with the SAE and RV standards. Six 1000 Ohm resistors are used, one in series with each LED, to reduce current and voltage across the LED and preserve LED life. The six LEDs themselves each have a current draw when lit which is only in the milliamp range, such as within the range of 10 to 30 mA, with a forward voltage which is less than 30% of the typical voltage output on the towing vehicle, such as a forward voltage in the range of 0.5 to 3V. Similar testers are available for other output socket configurations on towing vehicles, such as 4-way flat, 5-way flat, and 6-way round.

While the CURT 58270 tow electrical tester has worked well, some newer vehicles and brake controllers (CURT's ECHO brake controller included) will not output proper electrical signals to the seven way connection unless a trailer attachment is electrically detected. Problems in the electrical circuits for towing with these newer vehicles/brake controllers cannot be effectively identified and troubleshot using the CURT 58270 tow electrical tester. Better solutions are needed.

BRIEF SUMMARY OF THE INVENTION

The present invention is a tow electrical tester for testing outputs of a plug on a towing vehicle. The tester includes a housing having a socket defining positions for at least four electrical connections between a towing vehicle and a towed vehicle, with the preferred embodiment shown having seven such socket positions in a standard seven round configuration. A plurality of indicator lights, preferably LEDs, are supported by the housing and exposed on a distal end of the housing. An electrical circuit within the housing connects each indicator light in a circuit branch between a common/ground socket position and one of the other socket positions. The electrical circuit includes a primary series resistor within the housing arranged in series for each LED (or other indicator light), which protects the LED/light and adjusts the forward voltage across the LED/light. For at least some of the circuit branches, a secondary parallel resistor is added within the housing arranged in parallel with the associated primary series resistor and indicator light, thereby increasing current draw within that branch to meet the requirements of "trailer present" detection circuits.

While the above-identified drawing figures set forth a preferred embodiment, other embodiments of the present invention are also contemplated, some of which are noted in the discussion. In all cases, this disclosure presents the illustrated embodiments of the present invention by way of representation and not limitation. Numerous other minor modifications and embodiments can be devised by those skilled in the art which fall within the scope and spirit of the principles of this invention.

DETAILED DESCRIPTION OF THE PREFERRED EMBODIMENTS

The present invention is a tow electrical tester 10 which better simulates a trailer connection to overcome the deficiencies of existing tow electrical testers. The tester 10 includes a housing 12, with a plurality of socket openings 14 on one end for plugging in to the output of a towing vehicle (not shown) in the location that the trailer (not shown) or other towed vehicle would electrically plug in to the towing vehicle. For each electrical input in the socket 16 other than common/ground, the tester 10 includes an exposed light D1, D2, D3, D4, D5, D6, such as an LED, to indicate whether that circuit/output is being powered by the towing vehicle.

Figure 1:
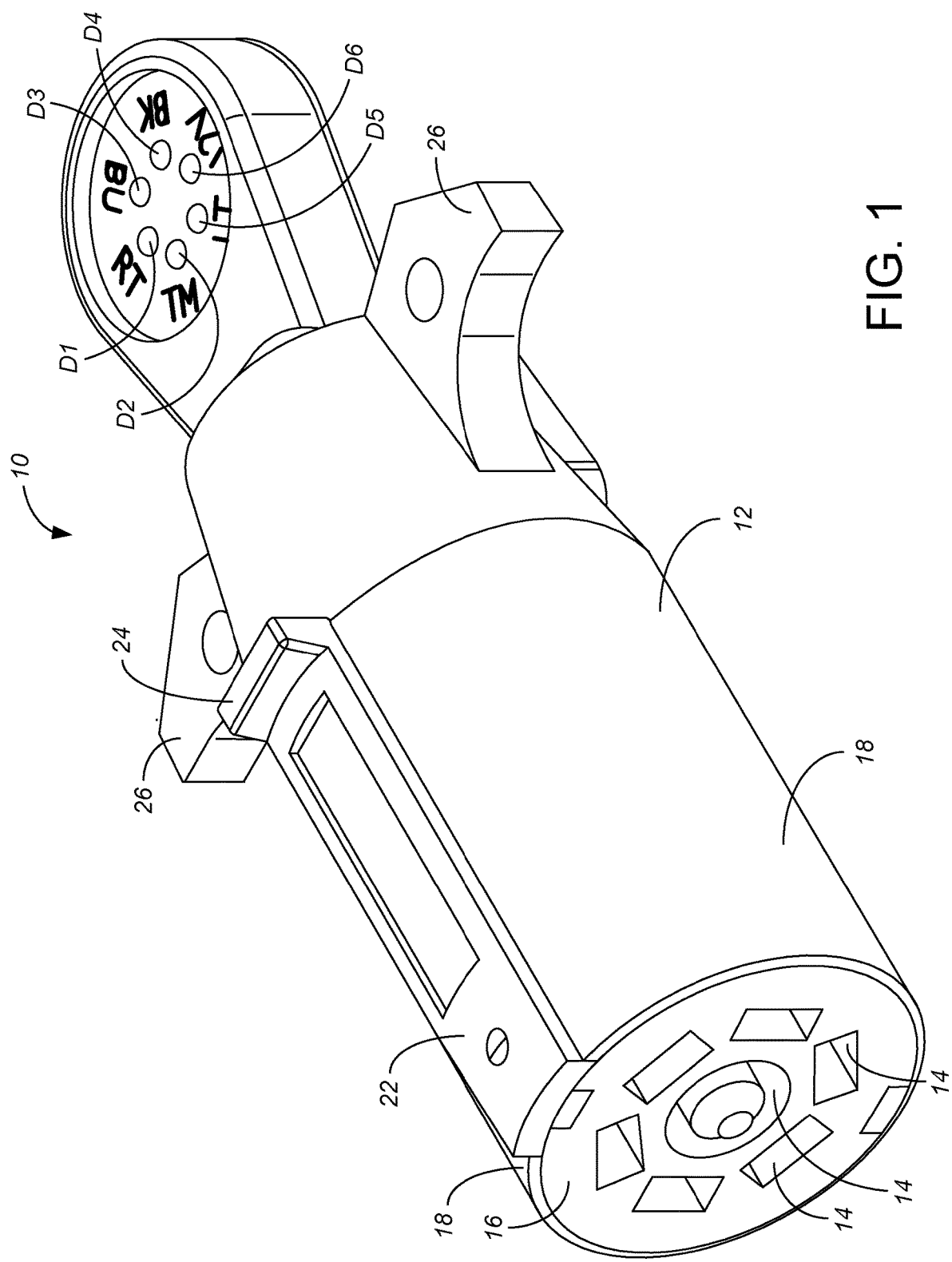
FIG. 1 is a perspective view of a tow electrical tester in accordance with a preferred embodiment of the invention.
Figure 2:
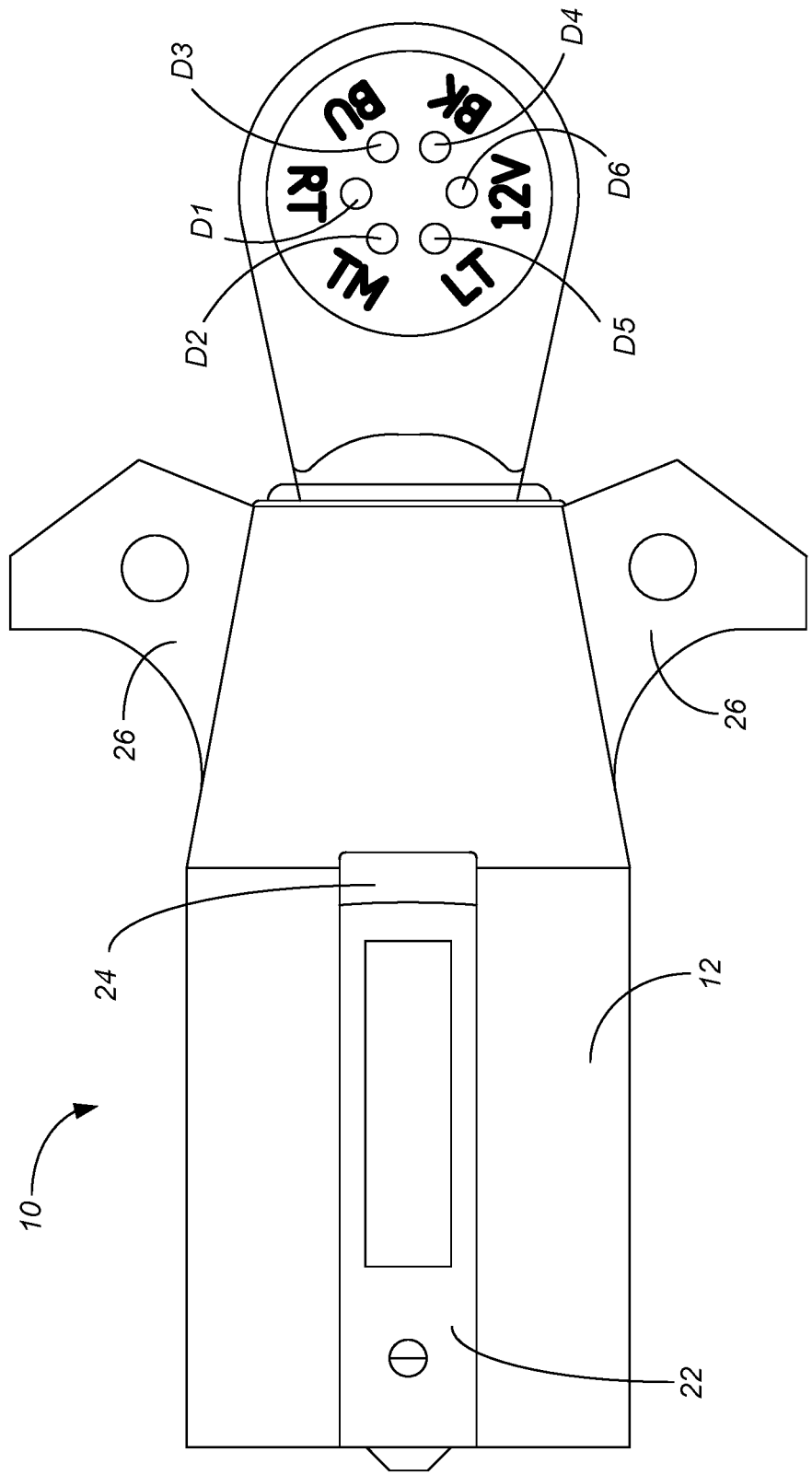
FIG. 2 is a top plan view of the tow electrical tester of FIG. 1.
Figure 3:
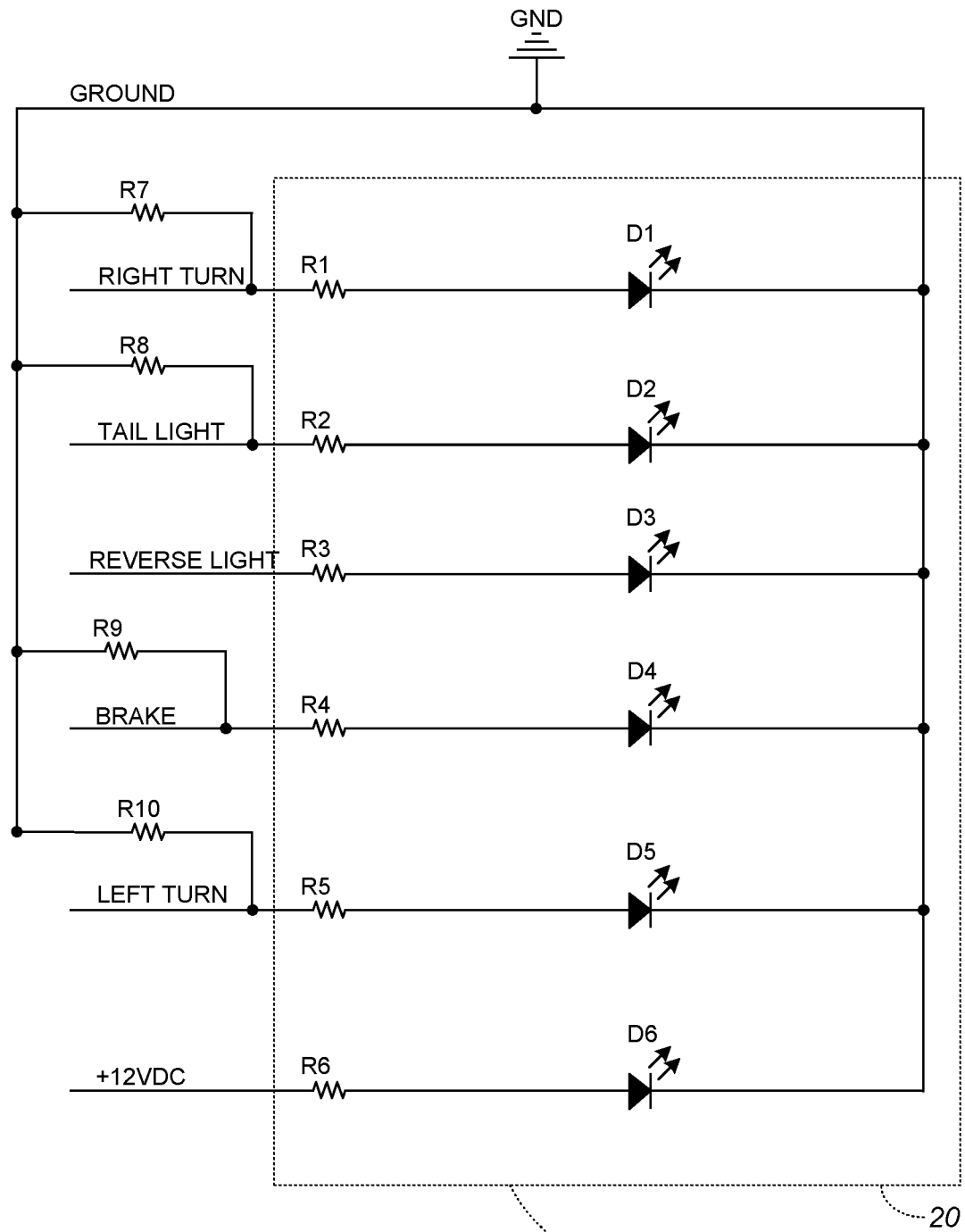
FIG. 3 is an electrical circuit diagram of the tow electrical tester of FIGS. 1 and 2.

The housing 12 is formed of a dielectric material, and more preferably formed of two molded plastic parts 18 joined around a socket terminal block 16 and a circuit board 20. For example, the plastic material could be polycarbonate or ABS (Acrylonitrile Butadiene Styrene). As best shown in FIGS. 1 and 2, the housing 12 includes an exterior shape which mates in a single orientation with the plug (not shown) of the towing vehicle, such as having longitudinally running key 22 which mates into a longitudinally running key slot on the towing vehicle plug. The key 22 may have an end stop 24 located to mate with a towing vehicle plug cover (not shown) to assist in holding the tester 10 into the towing vehicle plug. The preferred housing 12 is generally cylindrical, such as having an outer diameter of about 1⅞ inches and an overall length of about 5⅛ inches. The preferred housing 12 includes two opposing finger holds 26, centered but toward the distal end and distal of the end stop 24 of the key 22, primarily to allow the user to more easily pull the housing 12 out of the towing vehicle plug. A plurality of indicator lights D1, D2, D3, D4, D5, D6, preferably LEDs, are exposed on the distal end of the housing 12 beyond the end stop 24. The indicator lights D1, D2, D3, D4, D5, D6 are preferably directed upward relative to the standard orientation of the key slot on the towing vehicle plug, and are thereby fully exposed for viewing when plugged into the towing vehicle outlet. While the housing 12 could be colored black in accordance with prior art testers, more preferably the housing color is changed from black to orange, thereby readily identifying to the user that this part is a tester, and not merely a disconnected plug part.

If desired, the LEDs D1, D2, D3, D4, D5, D6 may all be colored red so as to reduce the cost of the tester 10. However, rather than just red LEDs, lenses for each of the six LEDs D1, D2, D3, D4, D5, D6 can be separately colored (brown, green, yellow, blue, red and purple, respectively), to generally correspond with the color of the wire most commonly used in the associated trailer wiring. The colored LEDs D1, D2, D3, D4, D5, D6 help play an important role for do-it-yourselfers who are troubleshooting towed vehicle wiring. For instance, if the towed vehicle's backup lights are not working, but the tester 10 lights the purple BU LED D3 when the driver places the towing vehicle in reverse, then the user is signaled by the purple light to inspect purple wiring on the towed vehicle. Of course, such signaling depends upon the user having a tester with LED colors that match the standard of the towed vehicle. The colors are subject to change based upon availability both of LEDs and of lens colors, as well as based upon the translucency of the lens and brightness of the LED in the field of use. For example, the brown lens may be replaced with a clear lens over a white light LED, and the user advised that the white LED provides testing for the brown wire (right turn/brake signal). The housing 12 preferably also has indicia next to each LED D1, D2, D3, D4, D5, D6 to indicate which circuit is connected for that LED. In the preferred embodiment shown, these indicia are a) "12V", adjacent the LED D6 lit when the hot (black) power wire/socket position is powered by the towing vehicle relative to the (white) neutral or ground power wire/socket position;

b) "BK", adjacent the LED D4 lit when the (blue) braking power wire/socket position is powered by the towing vehicle relative to the (white) neutral or ground power wire/socket position;

c) "BU", adjacent the LED D3 lit when the (purple/yellow) reverse or backup wire/socket position is powered by the towing vehicle relative to the (white) neutral or ground power wire/socket position;

d) "RT", adjacent the LED D1 lit when the (green/brown) right turn/brake signal wire/socket position is powered by the towing vehicle relative to the (white) neutral or ground power wire/socket position;

e) "TM", adjacent the LED D2 lit when the (brown/green) tail/marker light wire/socket position is powered by the towing vehicle relative to the (white) neutral or ground power wire/socket position; and f) "LT", adjacent the LED D5 lit when the (yellow/red) left turn/brake signal wire/socket position is powered by the towing vehicle relative to the (white) neutral or ground power wire/socket position.

Figure 4:
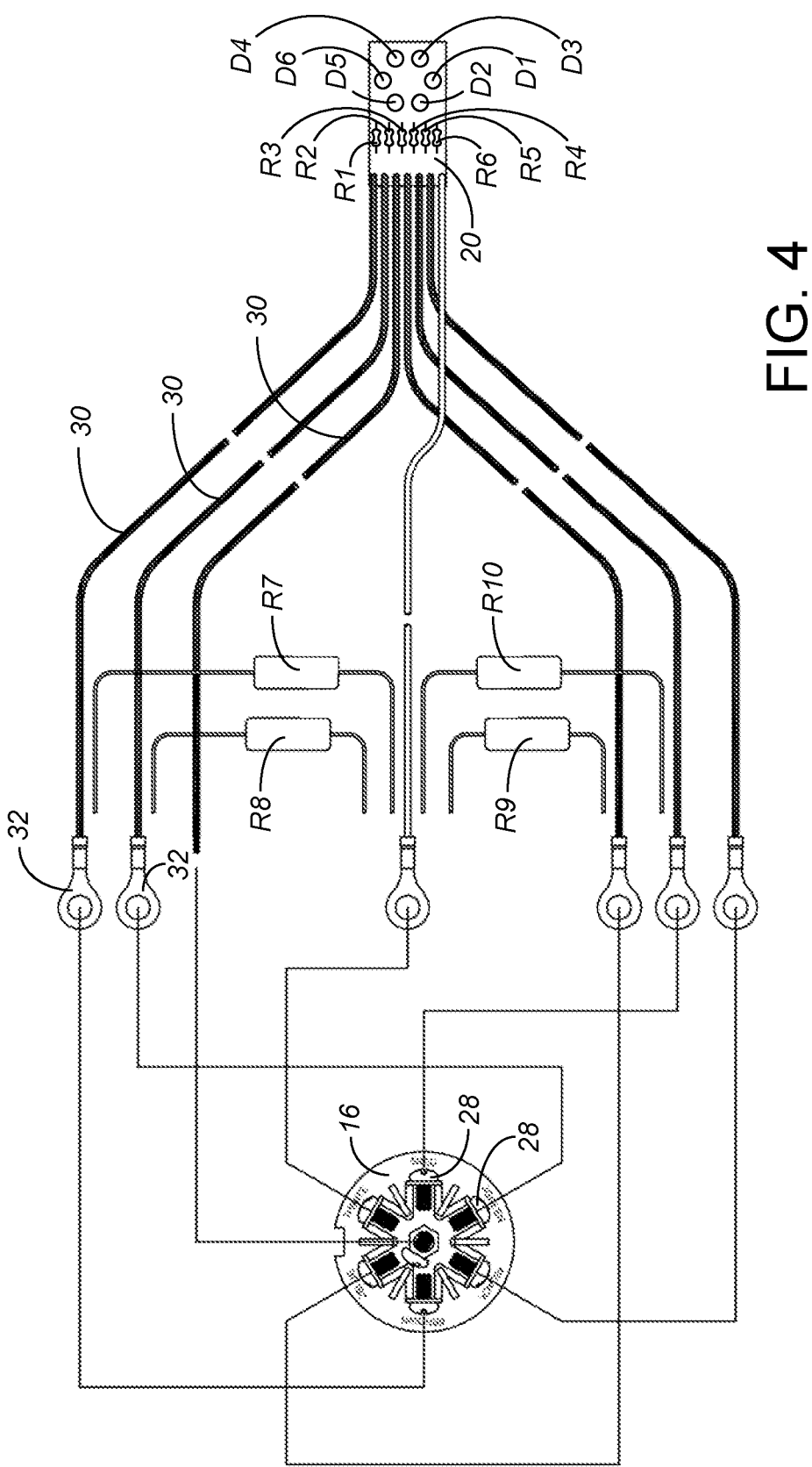
FIG. 4 is a top plan view, partially schematical, of the electrical circuit for the tow electrical tester of FIGS. 1-3.

FIG. 4 better shows the circuit board 20 used in the tester 10. The preferred circuit board 20 is about 1.5 inches long and 0.75 inches wide, with the LEDs D1, D2, D3, D4, D5, D6 arranged to form a circle. A primary series resistor is included on the circuit board 20 as part of the electrical trace for each LED, such as six primary series resistors R1, R2, R3, R4, R5, R6 for six LEDs D1, D2, D3, D4, D5, D6, each in their own branch of the circuit between the associated output socket position and the neutral/ground socket position. If desired, several or all of the primary series resistors R1, R2, R3, R4, R5, R6 may be placed on the bottom side of the circuit board 20 instead of the top side, so the resistors R1, R2, R3, R4, R5, R6 interfere less with placement of the circuit board 20 so the LEDs D1, D2, D3, D4, D5, D6 are exposed through the opaque housing 12 and visible during tester use. The resistance of the primary series resistor R1, R2, R3, R4, R5, R6 is selected to increase brightness and longevity of each of the LEDs D1, D2, D3, D4, D5, D6. For instance, the circuit board 20 itself may be identical to circuit boards used for prior art models. In the most preferred embodiment, six 1k Ohm resistors R1, R2, R3, R4, R5, R6 are used, one in series with each LED D1, D2, D3, D4, D5, D6. The LEDs D1, D2, D3, D4, D5, D6 are preferably fairly small (such as 3 mm LEDs) but bright enough to be seen in full sunlight. The LEDs D1, D2, D3, D4, D5, D6 themselves each have a current draw when lit which is only in the milliamp range, such as within the range of 10 to 30 mA, with a forward voltage which is less than 30% of the typical voltage output on the towing vehicle, such as a forward voltage in the range of 0.5 to 3V.

Most importantly, additional secondary parallel resistors R7, R8, R9, R10 are added, in parallel with the primary series resistor R1, R2, R4, R5 and LED D1, D2, D4, D5, on each branch circuit for which "trailer present" detection is common. In the preferred embodiment, second parallel resistors R7, R8, R9, R10 are added for each of the RT, LT, BK and TM branch circuits. The resistance of each secondary parallel resistor R7, R8, R9, R10 should be lower than the resistance of its associated primary series resistor R1, R2, R4, R5, and more preferably 50% or less of the resistance of the associated primary series resistor R1, R2, R4, R5 in that branch of the circuit. For instance, the resistance of each secondary parallel resistor R7, R8, R9, R10 should be lower than 400 Ohms, to thereby draw sufficient current that any "trailer present" detection circuit senses the connection. In the most preferred embodiment, the second parallel resistors R7, R8, R9, R10 have a resistance which is 10% of the resistance of the associated primary series resistor R1, R2, R4, R5, i.e., a resistance of 100 ohms. These four 100 ohm resistors R7, R8, R9, R10 provide a simple and elegant way to simulate an actual trailer connection so newer vehicles and brake controllers still output proper electrical signals to the seven way connection. The back-up light and the 12V power circuit branches utilize only the 1000 Ohm resistors R3, R6, as no change was required to these two circuit branches to convince the new vehicles/brake controllers to output proper electrical signals to the seven way connection.

Figure 6:
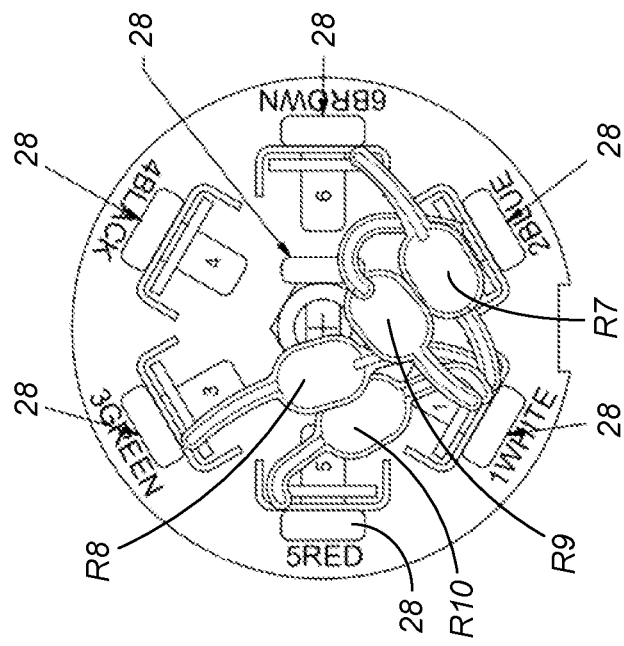
FIG. 6 is an interior end view of the socket connection and resistors of FIG. 5.
Figure 5:
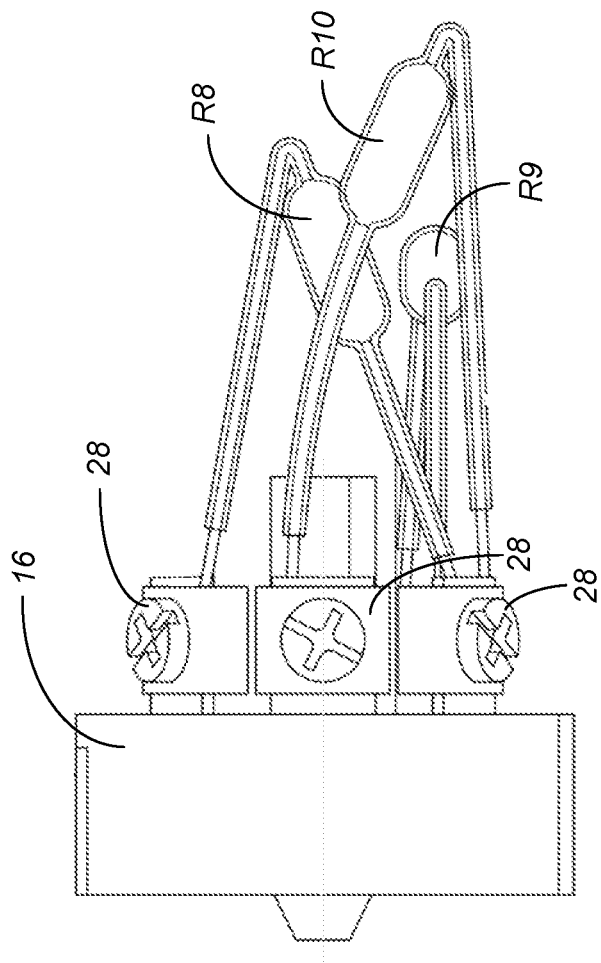
FIG. 5 is a side view of the socket connection within the tow electrical tester of FIGS. 1-4, assembled with the additional resistors.

In one preferred embodiment shown in FIGS. 4-6, the four 100 ohm resistors R7, R8, R9, R10 are added as separate individual component parts on the socket terminal block 16, such that the inventive tow electrical tester 10 can utilize the identical circuit board 20 currently used in the 58270 tow electrical tester. The seven-round socket terminal block 16 at the proximal end of the housing 12 is a standard commercially available component, providing a screw connector 28 for each of the seven terminals 14. In this preferred embodiment, the standard seven-round socket terminal block 16 includes indicia on the inside face adjacent the six outer screw connectors 28, with the indicia being consistent with the RV seven-round standard ("1WHITE" for neutral/ground, "2BLUE" for brake power signal; "3GREEN" for tail/marker light; "4BLACK" for hot power, "5RED" for left turn/brake light; and "6BROWN" for right turn/brake light). The socket terminal block 16 may further have indicia (too small to show in FIGS. 4 and 6), such as "GROUND", "ELECTICAL BRAKE", "TAILLIGHTS", "+12 VOLT", "LEFT TURN", "RIGHT TURN", and "REVERSE LIGHT", explaining the functional role of each wire. As shown in FIG. 4, the circuit board 20 is preferably wired to the socket terminal block 16 using seven wires 30. Each of these seven wires 30 preferably has one metal end soldered to the circuit board 20, an opposing metal end with a ring connector 32, and runs the length of the housing 12 within a dielectric (preferably PVC, polyurethane, polyethylene or polyimide) jacket. Each jacket can be colored appropriately to assist in identification and making proper connections during assembly. The circuit board 20 may bear indicia (too small to show in FIG. 4) associated with the appropriate color for each wire, such as "6BROWN", "3GREEN", "7PURPLE", "2BLUE", "5RED", "4BLACK", and "1WHITE" from top to bottom on FIG. 4. After connecting the wiring for each of the individual secondary parallel resistors R7, R8, R9, R10, the resistor R7, R8, R9, R10, is preferably protected within shrink wrap tubing (not shown). In another preferred embodiment (not shown), the four secondary parallel resistors are added into the circuit board 20.

The ten total resistors R1-R10 in the tester 10 provide a resistor network as part of the overall electrical circuit, such that the total resistance of at least one branch between a common/ground socket position 14 and one of the other socket positions 14 is less than 400 Ohms, thereby fulfilling the requirements of a "trailer present" detection circuit across that branch. At the same time, the forward voltage across the LED D1-D6 within that branch is controlled by the resistor network to be less than 30% of the applied voltage the connected socket positions, thereby still preserving and protecting the LED D1-D6. While the resistor network with ten total resistors R1-R10 simply fulfills these requirements for all six LEDs D1-D6, other resistor networks can be devised in accordance with the teachings of this specification which similarly meet these requirements.

Versions of the present invention have been built and successfully tested with the ECHO brake controller (further described in U.S. Pat. No. 11,390,256, incorporated by reference) and on 2018 and 2019 FORD F-150 trucks with smart trailer technology, which performed as if a trailer was connected. The electrical tester 10 of the present invention is thus perfect for testing a new wiring harness or for troubleshooting existing wiring, and particularly for testing tail lights, turn signals, brake lights, ground connections and other electrical components on the towed vehicle, regardless of the sensing technology on the circuits providing towing electrical outputs on the towing vehicle. For each electrical function, an LED D1-D6 lights up indicating a good signal. A user just plugs the wiring tester 10 into the towing vehicle's electrical towing output plug and has a helper check the LED signals as each function on the towing vehicle is activated from the driver's seat.

Although the present invention has been described with reference to preferred embodiments, workers skilled in the art will recognize that changes may be made in form and detail without departing from the spirit and scope of the invention. In particular, all of the dimensions and materials, unless included in the claims, are exemplary only.

The invention claimed is:

1. A tow electrical tester for testing outputs of a plug on a towing vehicle, comprising:
   a housing having a socket defining positions for at least four electrical connections between a towing vehicle and a towed vehicle, the socket being on a proximal end of the housing;
   a plurality of indicator lights supported by the housing and exposed on a distal end of the housing;
   an electrical circuit with a plurality of branches including one branch for each indicator light, wherein at least one branch comprises:
      a primary series resistor within the housing arranged in series with one of the indicator lights between a common/ground socket position and one of the other socket positions, such that said one of the indicator lights illuminates whenever the towing vehicle is providing power between said one of the other socket positions and the common-ground socket position; and
a secondary parallel resistor within the housing arranged in parallel with the associated primary series resistor and indicator light between the common/ground socket position and said one of the other socket positions.

2. The tow electrical tester of claim 1, wherein a plurality of the branches include the secondary parallel resistor, wherein the secondary parallel resistors are each directly connected from the associated other socket position to the common-ground socket position.

3. The tow electrical tester of claim 2, wherein at least one branch omits the secondary parallel resistor.

4. The tow electrical tester of claim 3, wherein at least one branch omitting the secondary parallel resistor runs between a common/ground socket position and a hot power socket position.

5. A tow electrical tester for testing outputs of a plug on a towing vehicle, comprising:
a housing having a socket defining positions for at least four electrical connections between a towing vehicle and a towed vehicle, the socket being on a proximal end of the housing;
a plurality of indicator lights supported by the housing and exposed on a distal end of the housing;
an electrical circuit with a plurality of branches including one branch for each indicator light, wherein a plurality of branches comprise:
a primary series resistor within the housing arranged in series with one of the indicator lights between a common/ground socket position and one of the other socket positions; and
a secondary parallel resistor within the housing arranged in parallel with the associated primary series resistor and indicator light;
wherein at least one branch omitting the secondary parallel resistor runs between the common/ground socket position and a hot power socket position; and
wherein at least one branch omitting the secondary parallel resistor runs between the common/ground socket position and a backup/reverse signal socket position.

6. The tow electrical tester of claim 5, wherein the plurality of branches with the secondary parallel resistor include:
a branch running between a common/ground socket position and a right turn/brake signal socket position;
a branch running between a common/ground socket position and a left turn/brake signal socket position;
a branch running between a common/ground socket position and a brake power socket position; and
a branch running between a common/ground socket position and a tail/marker light signal socket position.

7. The tow electrical tester of claim 6,
wherein each secondary parallel resistor has a resistance value which is 50% or lower than a resistance value of the primary series resistor within that branch;
wherein each of the indicator lights are LEDs;
wherein each of the primary series resistors and each of the LEDs are all mounted on a circuit board within the housing; and
wherein each of the secondary parallel resistors are not mounted on the circuit board.

8. The tow electrical tester of claim 7, wherein each of the LEDs outputs a different color light, and wherein the housing is molded of an orange plastic.

9. The tow electrical tester of claim 1, wherein each secondary parallel resistor has a resistance value which is less than a resistance value of the primary series resistor within that branch, to thereby draw sufficient current through the secondary parallel resistor that any trailer present detection circuit on the towing vehicle senses the connection.

10. The tow electrical tester of claim 9, wherein the resistance value of each secondary parallel resistor is 50% or lower than the resistance value of the primary series resistor within that branch.

11. A tow electrical tester for testing outputs of a plug on a towing vehicle, comprising:
a housing having a socket defining positions for at least four electrical connections between a towing vehicle and a towed vehicle, the socket being on a proximal end of the housing;
a plurality of indicator lights supported by the housing and exposed on a distal end of the housing;
an electrical circuit with a plurality of branches including one branch for each indicator light, wherein at least one branch comprises:
a primary series resistor within the housing arranged in series with one of the indicator lights between a common/ground socket position and one of the other socket positions; and
a secondary parallel resistor within the housing arranged in parallel with the associated primary series resistor and indicator light;
wherein each secondary parallel resistor has a resistance value which is 10% of a resistance value of the primary series resistor within that branch.

12. The tow electrical tester of claim 11, wherein the resistance value of each secondary parallel resistor is 100 Ohms, and wherein the resistance value of each primary series resistor is 1000 Ohms.

13. The tow electrical tester of claim 10, wherein each of the indicator lights are LEDs.

14. The tow electrical tester of claim 13, wherein each of the primary series resistors and each of the LEDs are all mounted on a circuit board within the housing, and wherein each of the secondary parallel resistors are not mounted on the circuit board, wherein the housing is formed of a dielectric material that encloses the circuit board and the secondary parallel resistors preventing external electrical connection to the circuit board and the secondary parallel resistors other than through the socket on the proximal end of the housing.

15. The tow electrical tester of claim 13, wherein each of the LEDs outputs a different color light.

16. The tow electrical tester of claim 13, wherein the housing is molded of an orange plastic.

17. A tow electrical tester for testing outputs of a plug on a towing vehicle, comprising:
a housing having a socket defining positions for at least four electrical connections between a towing vehicle and a towed vehicle, the socket being on a proximal end of the housing;
a circuit board disposed within the housing, the circuit board having a plurality of circuit branches, each branch comprising:
an LED exposed on a distal end of the housing; and
a primary series resistor arranged in series with the LED; and
at least one secondary parallel resistor within the housing and not on the circuit board, connected in parallel with one of the circuit branches on the circuit board, wherein the housing is formed of a dielectric material that encloses the circuit board and the secondary parallel resistor preventing external electrical connection to the circuit board and the secondary parallel resistors other than through the socket on the proximal end of the housing.

18. The tow electrical tester of claim 17, wherein there are a plurality of secondary parallel resistors within the housing and not on the circuit board, each of the secondary parallel resistors having one side electrically connected directly to a single common/ground socket position.

19. A tow electrical tester for testing outputs of a plug on a towing vehicle, comprising:
- a housing having a socket defining positions for at least four electrical connections between a towing vehicle and a towed vehicle, the socket being on a proximal end of the housing;
- a plurality of LEDs supported by the housing and exposed on a distal end of the housing;
- an electrical circuit with a plurality of branches including one branch for each LED; and
- a resistor network as part of the electrical circuit, such that the total resistance of at least one branch between a common/ground socket position and one of the other socket positions is less than 400 Ohms, and wherein a forward voltage across at least one LED is controlled by the resistor network to be less than 30% of the applied voltage between the common/ground socket position and that one of the other socket positions.

\* \* \* \* \*